United States Patent [19]
Busse-Grawitz et al.

[11] Patent Number: 5,552,710
[45] Date of Patent: Sep. 3, 1996

[54] METHOD AND AUTOMATIC AUXILIARY DEVICE FOR TUNING OF AN NMR RECEIVING COIL

[75] Inventors: Max E. Busse-Grawitz, Zumikon; Enrico Malacarne, Dübendorf; Walter Roeck, Zürich, all of Switzerland

[73] Assignee: Spectrospin AG, Switzerland

[21] Appl. No.: 499,856

[22] Filed: Jul. 10, 1995

[30] Foreign Application Priority Data

Aug. 12, 1994 [DE] Germany .................. 44 28 579.5

[51] Int. Cl.[6] .............................. G01V 3/00; G01V 3/14
[52] U.S. Cl. ............................................. 324/322; 324/318
[58] Field of Search .................................. 324/307, 309, 324/318, 322

[56] References Cited

FOREIGN PATENT DOCUMENTS

| 0114405 | 8/1984 | European Pat. Off. | ........ G01R 33/36 |
|---|---|---|---|
| 3903719 | 8/1989 | Germany | .................. G01R 33/36 |
| 3838252 | 5/1990 | Germany | .................. G01N 24/08 |

Primary Examiner—Sandra L. O'Shea
Assistant Examiner—Mack Haynes
Attorney, Agent, or Firm—Walter A. Hackler

[57] ABSTRACT

A method for tuning of the probe head impedance ($Z_x$) of an NMR receiver coil having a receiver circuit for an NMR signal with which, by means of an RF tuning signal (3), the probe head impedance ($Z_x$) is tuned via a first reference signal produced with real reference resistance ($R_0$) at one location M2 within the receiver circuit is characterized in that a reference impedance ($Z_0$) is matched at an arbitrary location in the path of the RF tuning signal (3) in the receiver circuit (10; 11) in such a fashion that a second reference signal corresponding to the first reference signal at location M2 occurs at location M2 and that subsequently, the probe head impedance ($Z_x$) is tuned to the second reference signal at location M2. In this fashion, in the path of the NMR signal at the input to the preamplifier, the number of necessary diodes, RF chokes and other components, which can lead to signal losses, is minimized. Furthermore, in the path of the NMR signal at the input to the preamplifier during normal operating conditions, all diodes which are located here are in a non-conducting state and there are no diodes in series with the path of the NMR signal.

13 Claims, 8 Drawing Sheets

METHOD AND AUTOMATIC AUXILIARY DEVICE FOR TUNING OF AN NMR RECEIVING COIL

BACKGROUND OF THE INVENTION

The invention concerns a method for tuning the probe head impedance of an NMR receiving coil having a receiving circuit for an NMR signal in which the probe head impedance is tuned by means of an RF tuning signal via a first reference signal produced with a real reference resistance at a location M2 within the receiving circuit.

A tuning procedure of this kind is, for example, known in the art through DE 38 38 252 A1.

In the method known in the art for tuning of the NMR receiving coil in the probe head of an NMR spectrometer, the probe head is not tuned by hand separate from the NMR receiver using distinct measuring instruments, rather the NMR receiver is already provided with suitable devices with which this procedure can be automatically carried-out under software control. Thereby the signal-to-noise ratio (S/N-ratio) of the NMR receiver during normal operating conditions should, to the extent possible, not be worsened.

The method known in the art largely utilizes an RF tuning source which delivers the signal for the tuning process, a reference resistance and various switches to automatically switch from the normal operating state into the "probe head tuning" operating state and back again. The reference resistance provides the desired probe head impedance and is switched at that location where the probe head impedance should be tuned to the value of the reference impedance. This reference impedance thereby represents the desired real resistance which should be assumed by the probe head impedance.

The S/N-ratio of the entire receiving system depends strongly on the network in the path of the NMR signal at the input to the preamplifier. Therefore this network should be provided with as few loss-ridden components, for example diodes and chokes, as possible. Since this network is in general low resistance (in the vicinity of 50$\Omega$) all types of series resistances, for example conducting diodes, should be avoided. Even a series resistance of 1 $\Omega$ can lead to a noticeable deterioration in the S/N-ratio.

Through the utilization of pin diodes as switches RF properties which are normally improved compared to those of other diodes are achieved. Nevertheless a conducting pin diode still has a series resistance of approximately 1 $\Omega$ and thereby causes, in the conducting state, non-negligible RF losses, for example 0.1 db, which is already excessive by today's standards.

In the non-conducting state a pin diode also causes RF losses which, however, are somewhat smaller than in the conducting state. The diode acts, in the non-conducting state, like a small capacitance of approximately 0.5 pF with a parallel loss resistance of approximately 8 k$\Omega$. A pin diode at the input to the preamplifier should therefore, in the normal operating state of the receiver system, preferably be non-conducting rather than conducting.

The RF choke known and used in prior art is also not an ideal component, since it has an RF impedance similar to that of a non-conducting pin diode, namely a capacitance of approximately 0.5 pF and a parallel resistance of approximately 5 k$\Omega$.

It is therefore the underlying purpose of the present invention to further improve a method of the above-mentioned kind in such a fashion that, in the path of the NMR signal at the input to the preamplifier as few diodes, RF chokes and other components which could lead to signal losses are utilized as possible. Furthermore, in the path of the NMR signal at the input of the preamplifier all diodes which are there present should be non-conducting in the normal operating state and no diodes in series with the path of the NMR signal should be utilized.

SUMMARY OF THE INVENTION

This purpose is achieved in accordance with the invention in that a reference impedance is matched at an arbitrary location in the path of the RF tuning signal of the receiver circuit in such a fashion that a second reference signal occurs at location M2 which corresponds to the first reference signal at the location M2, and, subsequently, the probe head impedance is tuned to the second reference signal at the location M2.

Due to the production of a second reference signal in accordance with the invention, it is no longer necessary that the reference resistance be switched at the reference point M2. In this fashion the number of components in the receiver circuit can be reduced leading to an improved S/N-ratio.

When producing the reference signal in the method in accordance with the invention it is only important that a signal dependence occurs for a separate input at reference point M2 which is practically identical, within the desired frequency range, to the signal dependence at reference point M2 when the input is not separated and if the reference resistance were connected at the desired tuning location instead of the probe head impedance. In order to fulfil this condition it is necessary that the RF tuning signal be changed with respect to its amplitude and phase only at one suitable location with the assistance of an adjustable reference impedance in such a fashion that, at the reference point M2 and with separated input, a second reference signal appears in accordance with the above-mentioned definition.

It is preferred when the first reference signal is at least tuned and stored once and, when matching the reference impedance, the second reference signal is periodically produced. A changing image then appears on the monitor screen during the tuning of the reference impedance and the reference impedance is varied until such time that the difference shown on the monitor screen between the reference signals is as close to zero as possible within the desired frequency range. In this case the second reference signal is practically identical to the first reference signal and in this fashion it is possible for the second reference signal to be utilized in place of a first reference signal for tuning the probe head impedance. The second reference signal has the substantial advantage that it can be measured with a circuit configuration which does not cause any noticeable deterioration in the S/N-ratio.

It is furthermore advantageous when the second reference signal is determined at least once and, during the tuning procedure of the probe head impedance, the signal determined with the assistance of the probe head impedance is periodically produced. In this case a changing image occurs on the monitor screen during tuning of the probe head impedance which has the shape of a vertical mirrored resonance curve. The tuning procedure is then terminated when the minimum of this resonance curve is approximately zero and lies at the desired frequency point.

Since the base line of the RF tuning signal can be subject to certain fluctuations during the tuning procedure of the probe head impedance, in a preferred embodiment, the second reference signal is determined again, at least once, at the beginning of the tuning procedure of the probe head impedance.

A particularly preferred embodiment of the method in accordance with the invention is characterized in that a change-over switch assumes the function of an RF series switch by means of a switchable DC-current from a voltage source. In this manner it is possible to avoid additional components at the input of the preamplifier which would have been otherwise necessary for the switch S1.

A switching device for carrying-out the tuning method in accordance with the invention is also within the framework of the invention comprising an RF generator for the production of the RF tuning signal and switching elements in the path of the NMR signal.

This type of switching device is also known in the art from DE 38 38 252 A1.

In the switching device known in the art, both the reference resistance as well as the RF generator are switched-in and -out by means of relays or pin diode switches. By means of the switch, the probe head impedance is replaced by the reference resistance which represents the desired real resistance which the probe head impedance is supposed to assume.

In a switching device in accordance with the invention the reference impedance is placed at a location within the receiver circuit which is separated from the path of the NMR signal by a high ohmic coupling impedance or by a plurality of high ohmic impedances. By way of example, the high ohmic coupling impedance can be arranged on the side facing the RF generator. In this fashion one prevents losses from the reference impedance and from the associated switches from coupling into the path of the NMR signal.

It is particularly advantageous when a plurality of adjustable impedances or tunable reactive impedances are arranged at suitable locations between the RF generator and the coupling impedance, for example at the input and output of a four terminal element which lies in the path of the RF tuning signal. The four terminal element can, for example, be a $\lambda/8$-conductor. In this fashion it is possible to tune the amplitude and phase of the RF tuning signal over a sufficiently large range. With only one single reference impedance, it is necessary for this impedance to have active as well as reactive components so that the amplitude and phase of the RF tuning signal can be correctly adjusted. An adjustable active component, for example an RF potentiometer, is however from an RF point of view a technically critical component. It is therefore advantageous when a plurality of adjustable reactive components are introduced at various locations within the receiver switch in order to adjust the amplitude and phase of the RF tuning signal over a sufficiently large range.

In a preferred embodiment the reactive impedances are trimming capacitors, for example at the input and end of a $\lambda/8$-conductor. The advantage of this configuration is in the exclusive utilization of trimming capacitors as adjustable components which can be better and more stably adjusted than an RF potentiometer.

In another preferred embodiment the reference impedance is separated by an attenuator from the RF generator. In this fashion the RF generator as well as the accompanying connecting conductors are always impedance matched, e.g. always see the correct load resistance independent of the tuning of the reference impedance.

In another embodiment of the switching device in accordance with the invention the reference impedance lies directly on the path of the NMR signal and the RF generator is separated by a coupling impedance from the path of the NMR signal.

In another preferred embodiment the reference impedance is configured as a variable resistance parallel to a trimming capacitor. The trimming capacitor takes into consideration the residual parasitic reactive impedances within the receiver circuit.

It is preferred when one or more switching elements are arranged in the path of the NMR signal as a result of which the connection to the probe head impedance can advantageously be periodically switched-in and -out.

In an additional embodiment, the direct current can be switched-in via the coupling impedance. By means of this direct current it is possible to transform one or a plurality of diodes in the path of the NMR signal, in a particularly simple fashion, into the conducting or non-conducting state.

Further advantages can be derived from the description and the accompanying drawing. The above-mentioned features and those to be described further below in accordance with the invention can be utilized in each case individually or collectively in arbitrary combination. The embodiments mentioned are therefore not to be considered as exhaustive enumerations, rather have exemplary character only.

The invention is represented in the drawing and will be more closely described and explained with reference to the embodiments.

DESCRIPTION OF THE PREFERRED EMBODIMENT

Figure 5:
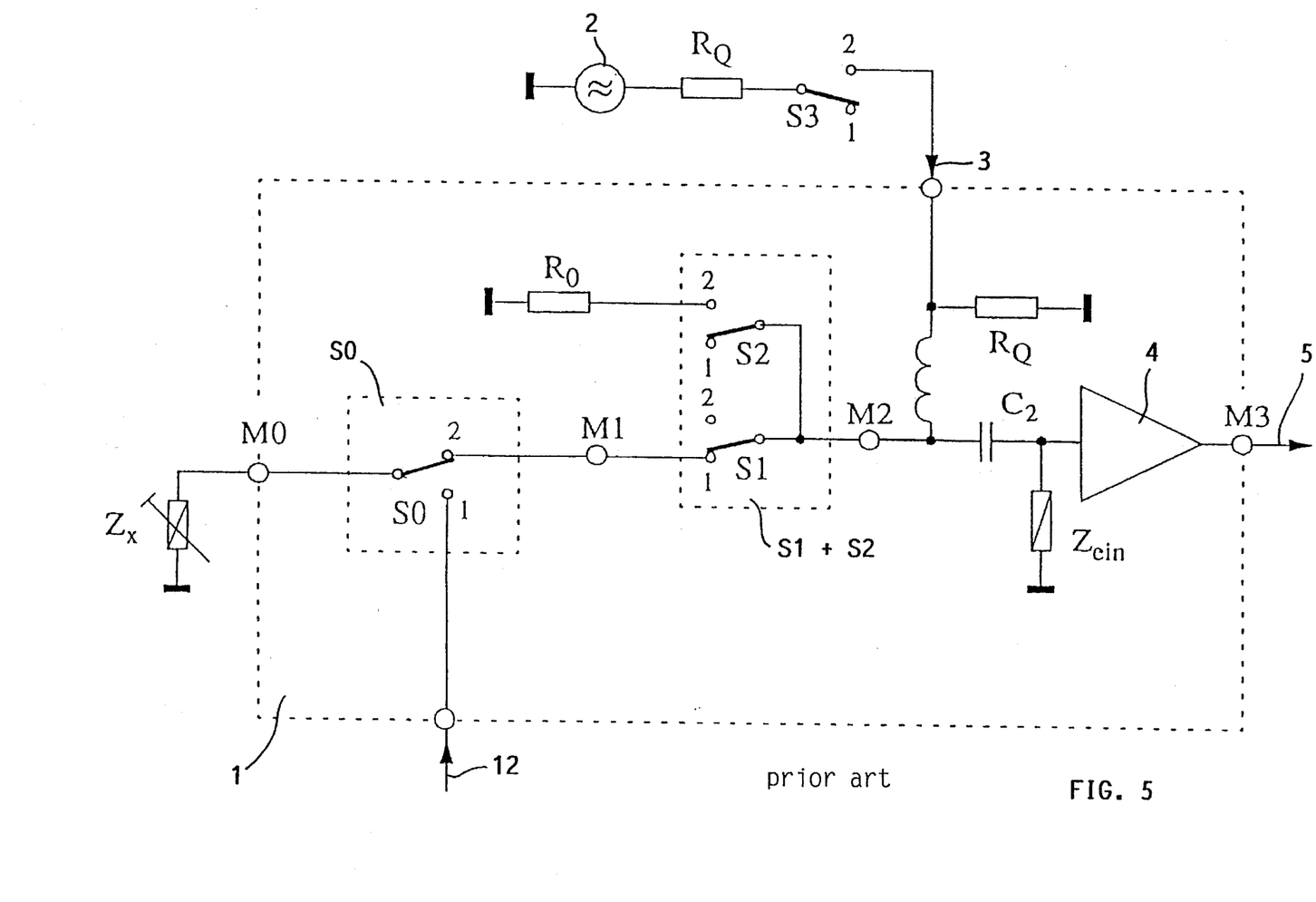
FIG. 5 shows a simplified representation of the switching configuration of prior art for tuning of the NMR receiving coil in a probe head of an NMR spectrometer (symbolic, not mechanical switches are represented)

The principle of operation of a receiving circuit 1 for tuning of the probe head impedance $Z_x$ of an NMR spectrometer (not shown) according to prior art is shown in FIG. 5. In the normal operating state, in which an RF excitation pulse is fed to the probe head coil for excitation, the switches S1, S2, and S3 are located in the position 1, e.g. the reference resistance $R_0$ as well as the RF tuning source, for example an RF generator 2, are switched-off. Initially the change-over switch S0 is brought to position 1 and the RF excitation coil 12 is fed for NMR excitation. Subsequently, the change-over switch S0 is moved to position 2 so that the probe head impedance $Z_x$ can be connected to the preamplifier 4 and the receiving system is ready to record the RF signal 5 amplified in this fashion at location M3.

The utilization of mechanical relays for the switches S1 and S2 is disadvantageous for a plurality of reasons: first of all due to the detrimental reliability of mechanical contact systems but also since these relays must work in the fringe fields of an NMR magnet and therefore cannot function in a reliable manner. For this reason diodes, preferentially pin diodes, are utilized.

Figure 6:
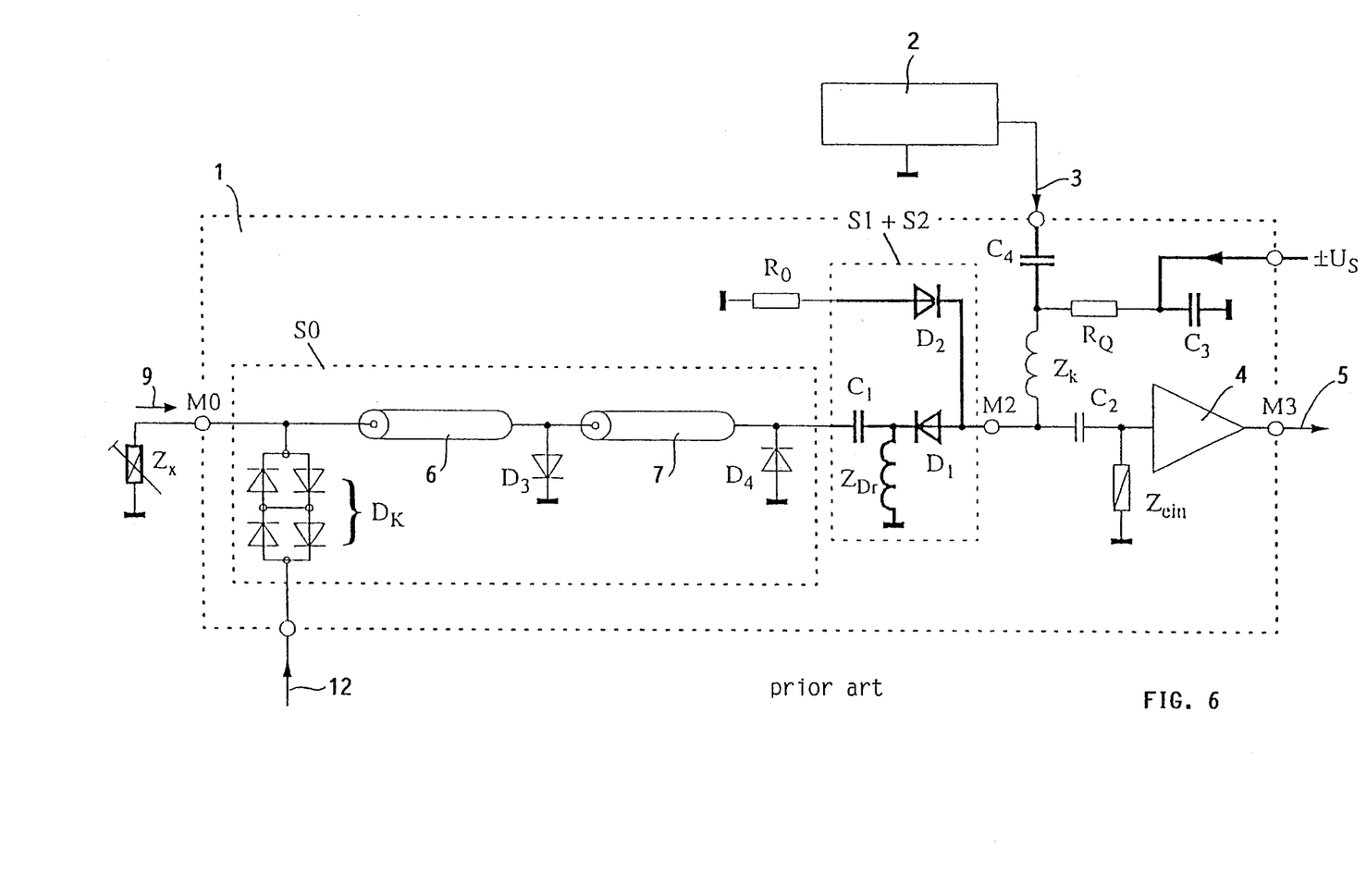
FIG. 6 shows a switching configuration corresponding to that of FIG. 5 in greater detail according to prior art.

A circuit of prior art in accordance with FIG. 5 utilizing pin diodes is shown in FIG. 6. The change-over switch S0 comprises, among other things, a diode chain $D_K$, which is directly brought into the conducting state via the RF transmitting pulse 12 and, in this fashion, conducts the RF transmitting pulse 12 to the point M0. The large amplitude (more than 100V) of this excitation pulse switches the pin diode $D_3$ on so that a first $\lambda/4$-conductor 6 is short-circuited on one side and represents a high ohmic impedance at the input M0 of the NMR spectrometer (not shown). The RF transmitting pulse 12 therefore chooses the path into the probe head or into the probe head impedance $Z_x$ and only a very small amount of energy (approximately 2%) is transferred towards the preamplifier 4. This residual energy is additionally damped with a second $\lambda/4$-conductor 7 as well as the likewise conducting pin diode $D_4$ in order to effectively protect the sensitive input to the preamplifier 4. The diodes $D_3$ and $D_4$ are oppositely connected to ground in order to more rapidly bring the diodes $D_3$ and $D_4$ into the conducting state during the switching-on phase of the RF transmitting pulse 12. In the event that the RF transmitting pulse 12 is positive going, then it is rectified at diode $D_3$ and the direct current can short via $D_4$ to likewise bring same into the conducting state. In the event of a negative going pulse the diode $D_4$ functions as the rectifier and $D_3$ is brought into the conducting state by means of the direct current. After a short time this rectifying effect vanishes and the pin diodes $D_3$ and $D_4$ act, from an RF point of view, as low ohmic resistance. This behavior is typical for pin diodes.

One should clearly observe at this point that the two $\lambda/4$-conductors 6, 7 and the diodes $D_3$ and $D_4$ serve only for feeding the highly energetic RF transmitting pulse 12 and for protecting the preamplifier 4. In the new circuit in accordance with the invention described further below, these components fulfil a dual function, which has substantial advantages.

The capacitors $C_1$, $C_3$, and $C_4$ and the choke $Z_{Dr}$ are necessary for the switching-on and -off of the pin diodes $D_1$ and $D_2$. They thereby serve to conduct the direct current produced by the switching voltage $U_S$ into the desired path. For an RF tuning signal 3 the three capacitors approximate shorts and the choke $Z_{Dr}$ a high ohmic impedance, comprising a small capacitor with losses.

When $U_S$ is positive, the diode $D_2$ is blocked and the diode $D_1$ is switched-on. In this fashion the probe head or its impedance $Z_x$ is connected via diode $D_1$ to the point M2. When $U_S$ is negative $D_1$ is blocked and $D_2$ is conducting as a result of which the reference resistance $R_0$ is connected via $D_2$ to the point M2.

After the RF excitation pulse 12 is switched-off again the diode chain $D_K$ and the diodes $D_3$ and $D_4$ are once more blocked. Both $\lambda/4$-conductors 6, 7 then act as normal RF conductors with a characteristic impedance $R_W = R_0 = 50\Omega$ and pass the arriving NMR signal with low attenuation. The latter gains access via diode $D_1$ to the preamplifier 4, is preamplified therein, mixed down to low frequencies in a subsequent receiver, amplified and phase-detected in quadrature, digitalized and processed into the desired signal in the computer.

In the operating state "probe head tuning" the RF generator is connected via the switch S3 and the tuning transpires in three steps:

Step 1: Switching-in of the reference resistance $R_0$

In prior art one assumes that the probe head impedance $Z_x$ at the input M0 is replaced by the reference resistance $R_0$. The reference resistance $R_0$ represents the desired real resistance which the probe head impedance $Z_x$ is supposed to assume. Since however, a resistance $R_0$ at the input M0 is transformed one to one via the two $\lambda/4$-conductors 6, 7 to point M2 (reason: characteristic impedance $R_W$ of the conductor is equal to $R_0$), it is sufficient to connect the reference resistance $R_0$ via the switch S2 directly to the point M2 and to separate the point M2 with the switch S1 from the input M0. The two switches S1 and S2 are moved to position 2.

It would be theoretically possible to place both switches S1 and S2 directly at the point M0 to achieve independence from the $\lambda/4$-conductors 6, 7. From a practical point of view this is, however, difficult since, during the duration of the RF transmitting pulse 12, very large RF voltages are present at this point. These would fully switch-on the two diodes $D_1$ and $D_2$ from which the switches S1 and S2 are comprised and, depending on the voltage, possibly destroy same.

Step 2: Production of the reference signal

The RF generator 2 is activated and delivers, via the high ohmic coupling impedance $Z_k$, an RF tuning signal 3 having a preferentially linearly changing frequency to the measuring point M2 at the input of the preamplifier 4. The frequency range of the signal should be centered at the desired operating frequency and have a bandwidth which is several times that of the receiving resonance circuit in the probe head.

This RF tuning signal 3 produces a signal at point M2 which depends strongly on the reference resistance $R_0$ and which gains entrance to a computer via the preamplifier 4 and receiver wherein it is stored. The stored signal is a vectorial signal in the complex plane and therefore has a real and an imaginary part which are given by the two outputs of the quadrature detector. Both components are frequency-dependent functions and define the reference signal necessary for the tuning process.

Step 3: Production of the difference signal

Switches S1 and S2 are again brought to position 1. In this fashion the probe head impedance $Z_x$ is switched to the point M2 via the $\lambda/4$-conductors 6, 7, e.g. to the same point at which the reference resistance $R_0$ was previously connected. The new signal which is produced by the RF tuning signal 3 of the RF generator 2 at the point M2 is processed further as in step 2 and stored in the computer. This signal is subsequently vectorially subtracted from the reference signal and the resulting absolute value formed. In this fashion the difference signal shown on the monitor screen is produced.

In the event that $Z_x$ is identical to $R_0$ within the measured frequency range, the difference signal assumes a value of zero everywhere. This case, however, never occurs, since the probe head impedance $Z_x$ is determined by the frequency-dependent receiver resonance circuit. The difference signal therefore has the shape of a vertically mirrored resonance curve, whereby the minimum represents the only point where $Z_x$ assumes a value $R_0$ e.g. where an exact impedance matching can occur.

The production of the difference signal is periodically and automatically repeated so that the changes which are caused by the tuning process can be observed. The tuning process normally transpires manually through changes in the resonance and coupling capacitance of the receiver resonance circuit. With a probe head which is not precisely tuned, the minimum of the difference signal appears outside of the desired operating frequency and is not zero. Only when the minimum lies at the desired operating frequency and assumes a value of zero is the tuning process completed.

Individual steps of the method in accordance with the invention are represented in FIGS. 1 through 4. VP1, VP2 and VP3 are arbitrary four terminal elements which are normally constructed from passive switching elements but can also contain active switching elements. VP1 is an arbitrary four terminal element in order to show that, in the method in accordance with the invention, the two points M0 and M2 must no longer be directly connected to each other via the switch S1. VP1 can, for example, be an impedance transformer with a complex voltage ratio.

VP2 can contain a high ohmic coupling impedance $Z_K$ (for example a choke) in order to separate the path 9 of the NMR signal from $Z_0$ but is, however, also to be viewed as an arbitrary four terminal element. VP3 can contain an attenuator 8 in order to separate $Z_0$ from the RF generator 2 as well as other circuit elements.

The novel reference production no longer utilizes a reference resistance $R_0$ of 50 Ω in the path 9 of the NMR signal, rather a reference impedance $Z_0$ (or a plurality at various locations) separated from path 9 of the NMR signal. $Z_0$ can be calculated mathematically (see below), whereby only an approximate value can result, since the parameters necessary for the calculation are not precisely known. In order to adjust $Z_0$ precisely to the correct value, a manual reference comparison is therefore still necessary. This, however, must only be repeated (if at all) at large time intervals (weeks, months, years), since only the aging effects of the circuit elements can cause a change in the correct matching. A more precise and stabler reference can be utilized as the reference quantity (reference resistance $R_0$) which can be placed at the desired tuning location.

Figure 1:
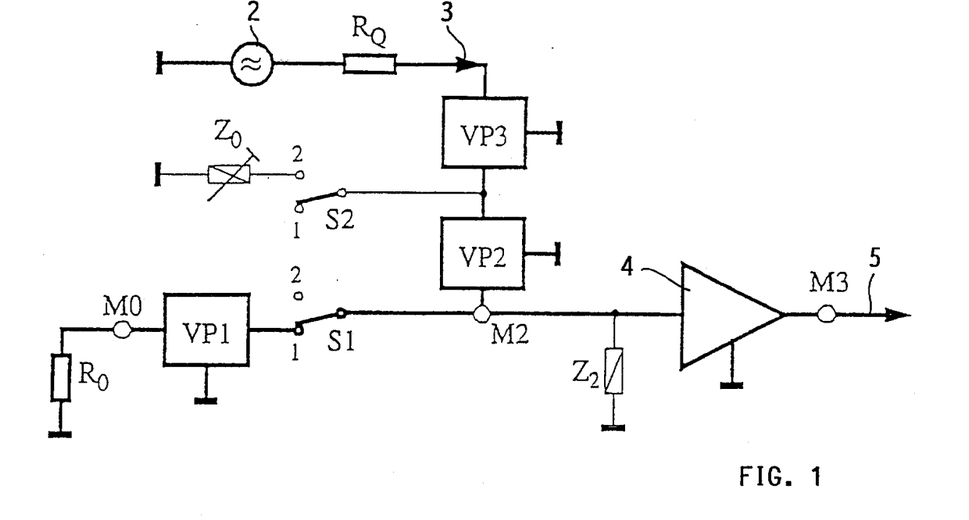
FIG. 1 shows a switching configuration for the semiautomatic tuning of an NMR receiving coil of an NMR spectrometer, represented in the switching state for the determination of the first reference signal.
Figure 2:
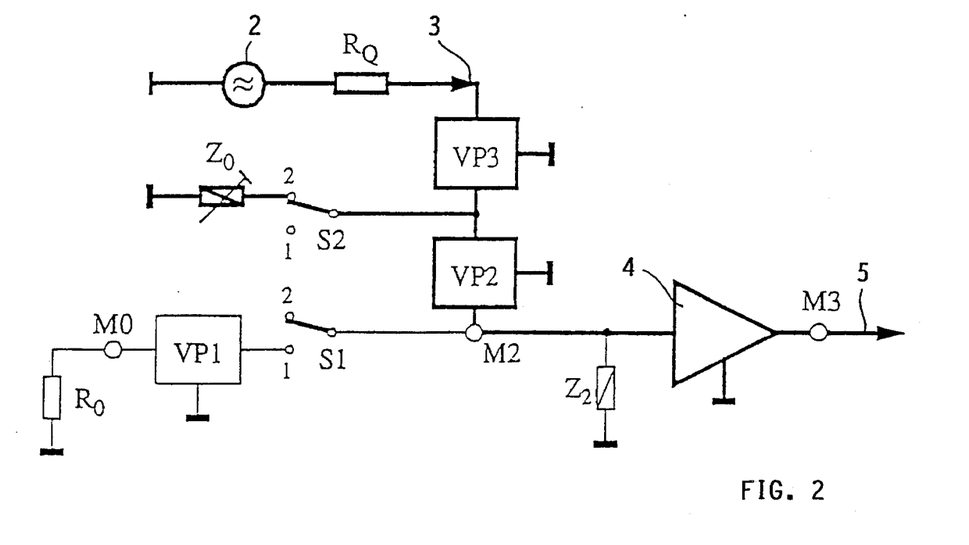
FIG. 2 shows the switching configuration of FIG. 1 in the switching state for the adjustment of the reference impedance $Z_0$.

The reference matching is represented in FIGS. 1 and 2. The reference resistance $R_0$ is connected at the input M0.

In a first step (switch S1 and S2 at position 1) $R_0$ is connected to the reference point M2 via VP1 and switch S1 and $Z_0$ is separated with the assistance of switch S2. (FIG. 1). This corresponds to the normal operating state with the exception that the desired resistance $R_0$ is present at the input M0 instead of the actual probe head impedance $Z_x$ and the RF generator 2 is switched-on. The RF tuning signal 3, whose frequency is linearly varied periodically between two values, produces a signal at reference point M2 which gains entrance to the computer via the preamplifier 4, receiver, quadrature detector and analog-to-digital converter (not shown). A complete period of this signal is vectorially stored and labelled as a first reference signal.

In a second step (switch S1 and S2 at position 2) $R_0$ is separated with the assistance of switch S1 from point M2 and the reference impedance $Z_0$ is switched-in via the switch S2 (FIG. 2). The next period of the RF tuning signal 3 produces a new signal at point M2 which is measured and vectorially stored analogous to the first step. This signal, subsequently referred to as a second reference signal, is vectorially subtracted from reference signal 1 and the absolute value is formed therefrom. In this fashion one obtains the difference signal A which can be shown as a y-signal on the monitor screen. The x-signal is defined by the frequency variation.

These two steps are periodically repeated so that, during the tuning of the reference impedance $Z_0$, a changing image appears on the monitor screen. $Z_0$ is then varied until the difference signal A on the monitor screen is as close to zero as possible within the desired frequency range. Thereby the second reference signal is practically identical to the first reference signal which means that, instead of the first reference signal, the second reference signal can be utilized. The latter has the substantial advantage that it can be measured with a circuit configuration which does not cause any noticeable deterioration in the S/N-ratio.

Figure 3:
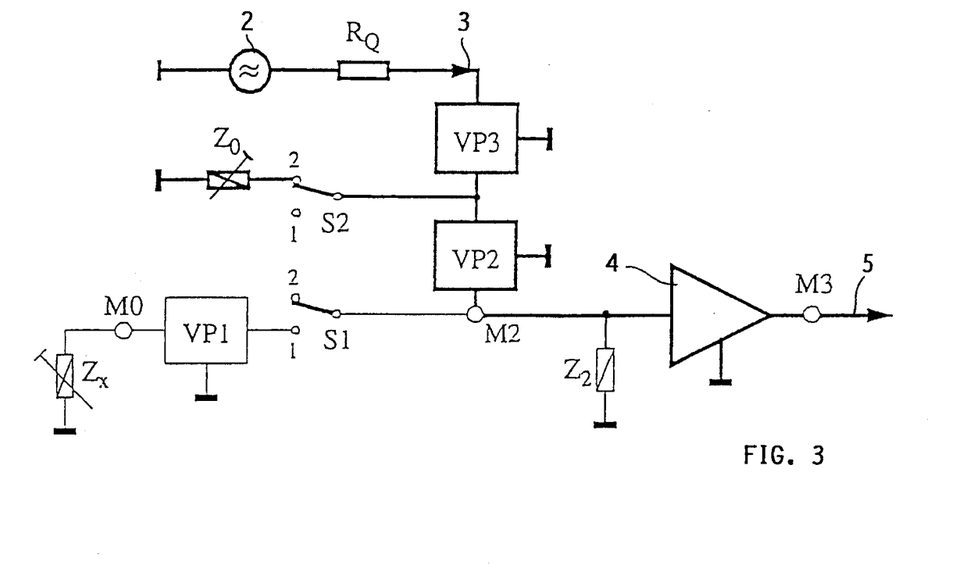
FIG. 3 shows the switching configuration of FIG. 1 in the switching state for the determination of the second reference signal.
Figure 4:
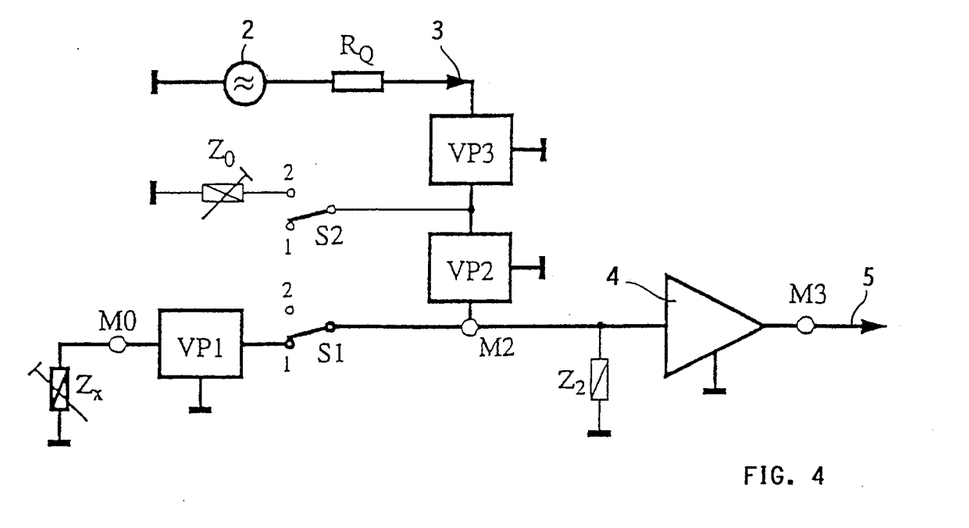
FIG. 4 shows the switching configuration of FIG. 3 in the switching state for the tuning of the sample probe head.

In order to tune the probe head the probe head impedance $Z_x$ must be present at input M0. The tuning procedure is represented in FIGS. 3 and 4. Two steps are also necessary:

In a first step (switch S1 and S2 on position 2) the second reference signal is measured during a period of linear frequency variation and vectorially stored (FIG. 3).

In a second step (switch S1 and S2 on position 1) the signal which is dependent on the probe head impedance $Z_x$ at point M2 is measured during the subsequent period of linear frequency variation (FIG. 4), vectorially stored, vectorially subtracted from the second reference signal and the absolute value thereof is formed. This signal is designated as the difference signal B. It is shown on the monitor screen as a y-signal. The x-signal is, for its part, defined by the frequency variation.

The two steps are periodically repeated so that a changing image appears on the monitor screen during tuning of the probe head impedance $Z_x$ which has the form of a vertically mirrored resonance curve. Although in the case of the second reference signal, no obvious change appears to take place, the repetition of step 1 cannot be omitted. One must namely take into consideration slow variations in the signal base line of the RF generator 2 during the duration of the tuning procedure which change the second reference signal.

The tuning procedure is then completed when the minimum of the curve is approximately zero and lies at the desired frequency point.

Figure 7:
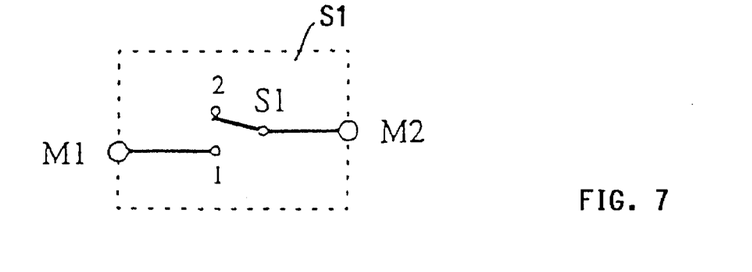
FIG. 7 shows an ideal series switch.

In order to periodically newly determine the second reference signal, it is necessary for the connection to the probe head or to the probe head impedance $Z_x$ to likewise periodically be switched-in and -out. A series switch, for example in the form of ideal series switch S1 of FIG. 7 in path 9 of the NMR signal is therefore unavoidable.

Figure 8:
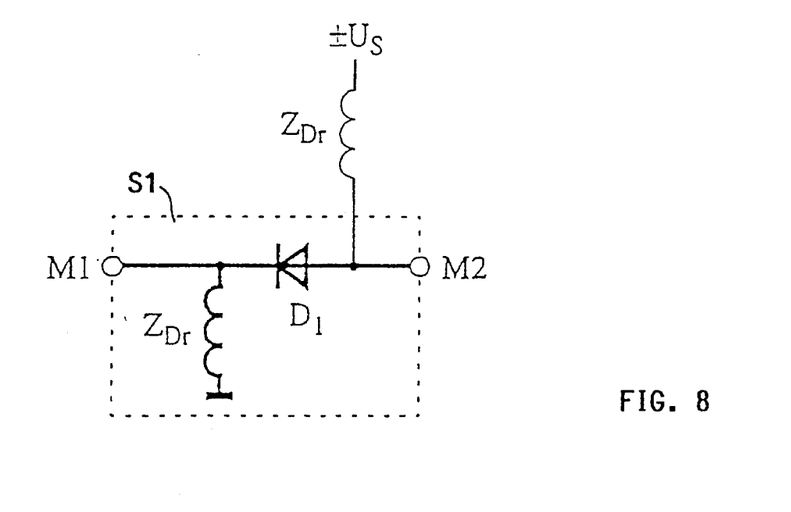
FIG. 8 shows a series switch comprising a series diode and a choke.

The solution, of using a series connected pin diode $D_1$ as a series switch (FIG. 8) is known in the art and leads, as already mentioned, to a deterioration in the S/N-ratio.

Figure 9:
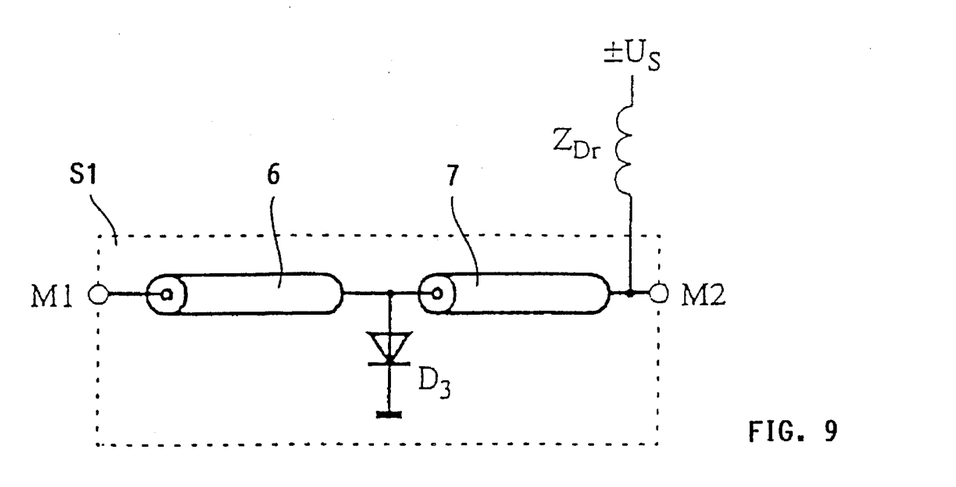
FIG. 9 shows a series switch configured from two $\lambda/4$-conductors and a parallel diode.

A low-loss series switch is represented in FIG. 9 which operates satisfactorily in the closed state with one blocked diode $D_3$. When $U_S$ is negative, the pin diode $D_3$ is non-conducting and the point M1 is directly connected via both λ/4-conductors 6, 7 to the point M2 in a low-loss fashion. This corresponds to the closed state of the series switch. This condition reigns during normal operation of the receiver system during which time, in particular, small signal losses should be assured. A non-conducting diode is therefore superior to a conducting one, since the former causes somewhat lower losses.

When $U_S$ is positive the pin diode $D_3$ conducts and represents a short to ground of approximately 1 Ω. This resistance is upwardly transformed by the λ/4-conductors 6, 7 and appears at the points M1 and M2 as a high ohmic resistance of approximately 2.5 kΩ which is largely negligible compared to 50 Ω. The impedance which is seen from both sides of the switch is nevertheless highly ohmic which corresponds to the open state of the series switch.

This type of series switch has the property that the switching diode is blocked in the closed state and conducts in the open state. This behavior is precisely opposite that of the conventional configuration (FIG. 8) where the switching diode is in series with path 9 of the NMR signal.

In comparing the described series switch (FIG. 9) to the change-over switch S0 of FIG. 6, certain similarities are recognizable. The change-over switch S0 already has all RF components necessary to the series switch S1, however, also has the additional diode chain $D_K$ and the diode $D_4$ which, however, do not interfere with the functioning of S1. It is thereby possible to realize the series switch $S_1$ without introducing additional components and to eliminate one diode ($D_1$), one choke ($Z_{Dr}$), and a capacitor ($C_1$) compared to the prior art shown in FIG. 6.

Figure 10:
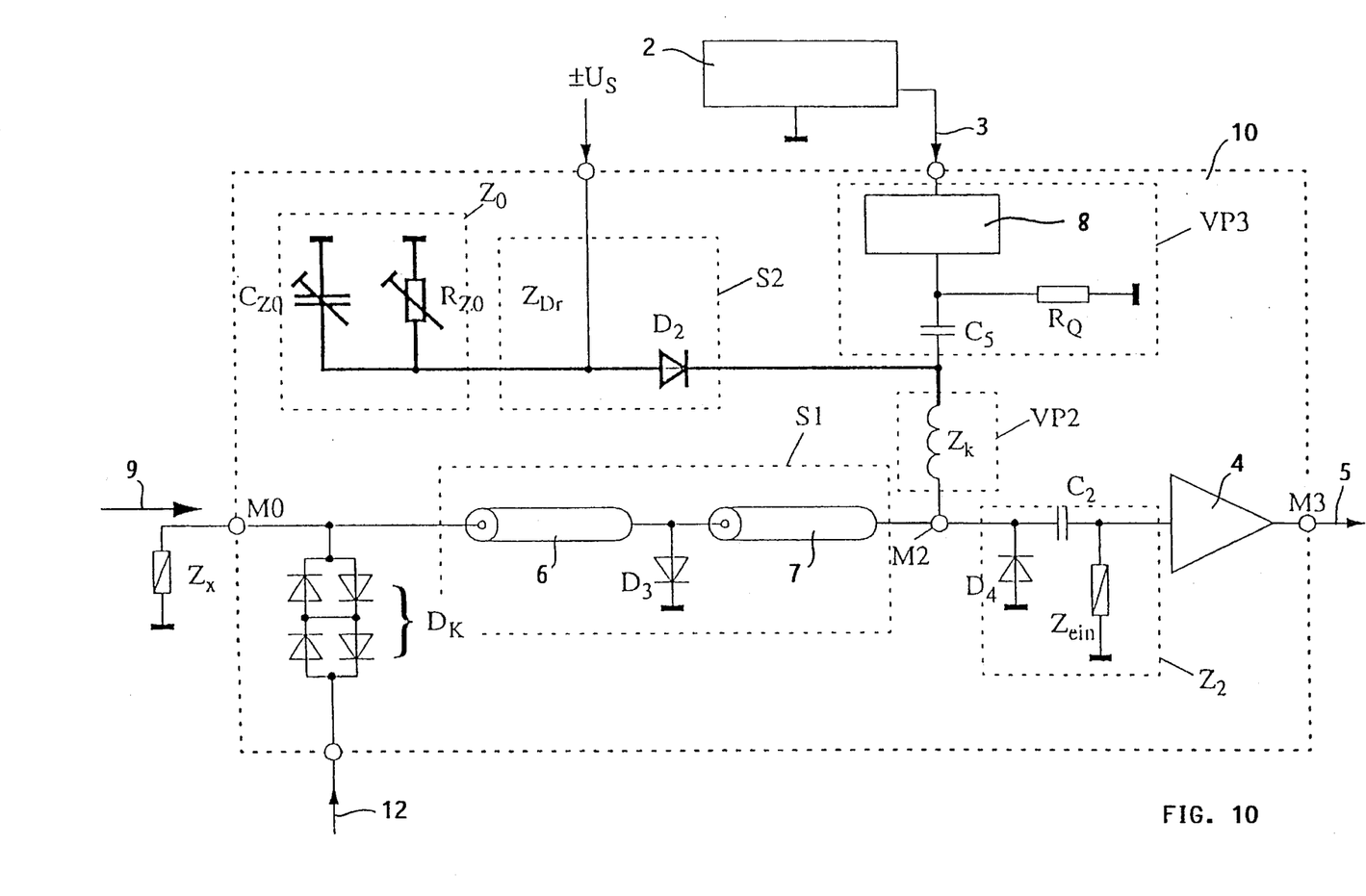
FIG. 10 shows a first embodiment of the automatic switching device in accordance with the invention for tuning the NMR receiving coil in the probe head of an NMR spectrometer, whereby the reference impedance $Z_0$ is separate from the path of the NMR signal.

FIG. 10 shows a first circuit configuration in accordance with the invention with which the reference impedance $Z_0$ is separated via the high ohmic coupling impedance $Z_k$ from path 9 of the NMR signal. The dashed boxed-in region refers to the function blocks utilized in FIGS. 5 and 6.

The four terminal element VP1 does not appear in FIG. 10. VP1 can, for example, indicate an impedance transformer with which, in the normal operating state, an additional impedance transformation is carried-out from point M0 to point M2. Since, however, this transformation is only utilized in very special cases, it is eliminated in FIG. 10.

The circuit of FIG. 10 utilizes the variation with only one tunable reference impedance $Z_0$. This can be realized by means of a variable resistance $R_{Z0}$ of approximately 100 Ω parallel to a trimming capacitor $C_{Z0}$ of approximately 15 pF. $C_{Z0}$ largely takes into consideration the residual parasitic reactive impedances within the circuit.

The attenuator 8 within the four terminal element VP3 separates the RF generator 2 from the reference impedance $Z_0$. In this fashion the RF generator 2 as well as the associated connecting conductors, are always impedance-matched, e.g. always see the proper load resistance independent of the tuning of $Z_0$.

Figure 11:
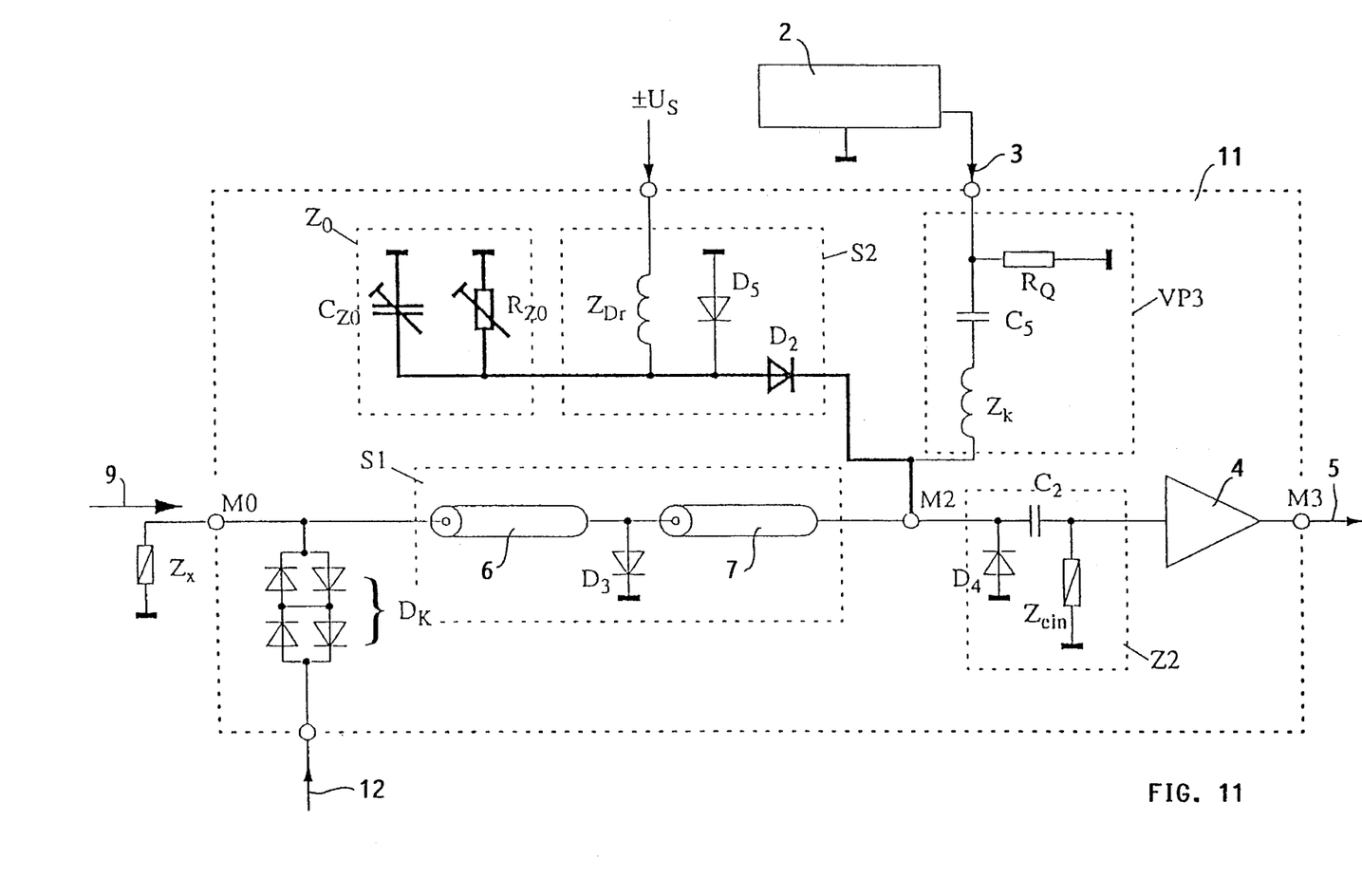
FIG. 11 shows a second embodiment of the switching device in accordance with the invention, whereby in contrast to FIG. 10, the reference impedance $Z_0$ lies directly on the path of the NMR signal.

FIG. 11 shows a second circuit configuration in accordance with the invention with which the reference impedance $Z_0$ lies directly on the path 9 of the NMR signal.

In this circuit the four terminal element VP2 is simplified into a direct connection. VP3 therefore contains the coupling impedance $Z_k$. The attenuator 8 is no longer necessary since $Z_0$ is separated from RF generator 2 by $Z_k$ and cannot therefore react with the RF generator 2.

The switch S2 is complemented by a second pin diode $D_5$ which is conducting when the switch S2 is opened (e.g. $D_2$ closed) and thereby short-circuits $Z_0$. In this fashion one prevents the active component of $Z_0$ from being transformed via the parasitic capacitance of the blocking diode $D_2$ into the path 9 of the NMR signal to thereby lead to a deterioration in the S/N-ratio.

The circuit configuration shown in FIG. 11 has a slight disadvantage compared to the circuit shown in FIG. 10, since it includes one additional diode ($D_2$) in the path 9 of the NMR signal. This, however, is blocked in the normal operating state and therefore leads to a somewhat smaller loss then if it were conducting. In addition the diode $D_5$ prevents an additional deterioration of the S/N-ratio due to the influence of $Z_0$.

The lengths of the two λ/4 conductors 6, 7 of the change-over switch S0 must not have the precise length of λ/4, in particular the second λ/4 conductor 7 can deviate by more than ±40% and nevertheless still sufficiently suppress the residual portion of the RF transmitting pulse 12 with the assistance of the diode $D_4$. Proper observance of the length of the first λ/4 conductor is, however, more critical. Here an imprecise length leads to an improper matching and to power reflections of the RF transmitting pulse 12 at the point M0 which cannot be too large. Nevertheless, also here tolerances in the length of ±5% are easily allowed.

The lengths of the λ/4 conductors 6, 7 of the RF series switch in FIG. 9 must likewise not be precisely λ/4. Deviations of more than ±40% are tolerable here, since they cause primarily (capacitively as well as inductively), reactive loads in the input and output of the switch.

Figure 12:
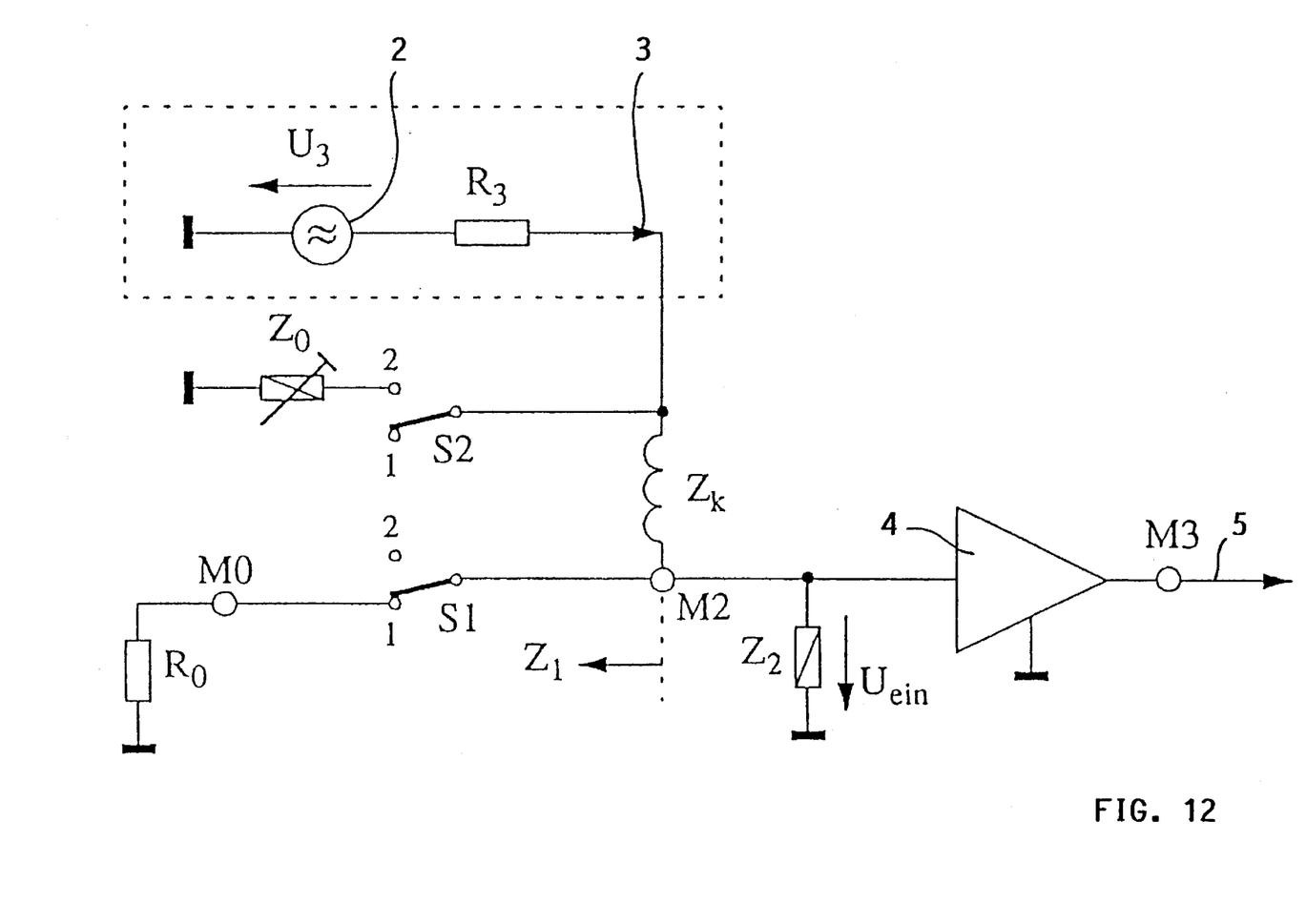
FIG. 12 shows a circuit for calculating the reference impedance $Z_0$ for separate configuration from the path of the NMR signal.

With the assistance of FIG. 12 the reference impedance $Z_0$ can be calculated in the following manner when same is arranged separately from the path of the NMR signal. Under the approximation that the impedance $Z_k$ is much larger than all other impedances one has for ($U_{ein}$):

in case 1, when S1 and S2 are in position 2 and $Z_1 = Z_1\infty$ $$(U_{ein})_1 = U_3 \cdot \frac{Z_0}{R_3 + Z_0} \cdot \frac{1}{Z_k} \cdot \frac{Z_2 Z_1^\infty}{Z_2 + Z_1^\infty} \quad ; \qquad 1)$$

in case 2, when S1 and S2 are in position 1:

$$(U_{ein})_2 = U_3 \cdot \frac{1}{Z_k} \cdot \frac{Z_2 R_0}{Z_2 + R_0} \quad . \qquad 2)$$

In order for $U_{ein}$ to be identical in both cases, it is necessary for $(U_{ein})_1 = (U_{ein})_2$, e.g.:

$$U_3 \cdot \frac{Z_0}{R_3 + Z_0} \cdot \frac{1}{Z_k} \cdot \frac{Z_2 Z_1^\infty}{Z_2 + Z_1^\infty} = U_3 \cdot \frac{1}{Z_k} \cdot \frac{Z_2 Z_0}{Z_2 + R_0} \qquad 3)$$

$$\frac{Z_0}{R_3 + Z_0} \cdot \frac{Z_1^\infty}{Z_2 + Z_1^\infty} = \frac{R_0}{Z_2 + R_0}$$

$$Z_0 = \frac{R_3 R_0}{Z_2} \cdot \frac{1 + (Z_2/Z_1^\infty)}{1 - (R_0/Z_1^\infty)} \approx \frac{R_3 R_0}{Z_2}$$

If the following numerical example is utilized in equation 3
$R_3 = R_0/2 = 25$ Ω
$R_0 = 50$ Ω
$Z_2 = 50$ Ω (=input impedance of the preamplifier 4)
$Z_1\infty = 2500$ Ω
one has for $Z_0$ $Z_0 = 26{,}02$ Ω.

We claim:

1. A method for tuning a probe head impedance of an NMR receiving coil using an RF tuning signal, the receiving coil having a receiving circuit for an NMR signal, the method comprising the steps of:

a) producing a first reference signal using a real reference resistance at an input to the receiving circuit;

b) matching a reference impedance connected to a path of the RF tuning signal in the receiving circuit to produce a second reference signal simulating the first reference signal at the input; and c) tuning the probe head impedance at the input to the second reference signal.

2. The method of claim 1, wherein the first reference signal of step a) is determined at least once and the second reference signal is periodically produced during step c).

3. The method of claim 1, wherein the second reference signal of step b) is determined at least once and a signal is periodically produced in dependence on the probe head impedance during step c).

4. The method of claim 1, wherein the second reference signal is determined at least once at the beginning of step c).

5. The method of claim 1, further comprising the step of switching-in a direct current from a voltage source to a change-over switch for causing the change-over switch to function as an RF series switch.

6. A switching device for tuning a probe head impedance of an NMR receiving coil using an RF tuning signal, the receiving coil having a receiving circuit for an NMR signal, the switching device comprising:

a) an RF generator for producing the RF tuning signal;

b) a switching element located in a path of the NMR signal;

c) a reference impedance matched to generate reference impedance signal simulating a reference resistance signal for tuning the probe head impedance; and d) a high ohmic coupling impedance means connected between the reference impedance and the path of the NMR signal and connected between the RF generator and the path of the NMR signal.

7. The switching device of claim 6, further comprising a plurality of adjustable impedances or of tunable reactive impedances arranged at suitable positions between the RF generator and the high ohmic coupling impedance.

8. The switching device of claim 7, wherein tunable reactive impedances are used, the tunable reactive impedances comprising trimming capacitors.

9. The switching device of claim 6, further comprising an attenuator separating the reference impedance from the RF generator.

10. The switching device of claim 6, wherein the reference impedance comprises a variable resistance in parallel with a trimming capacitor.

11. The switching device of claim 10, further comprising a voltage source for generating a DC-current, the DC-current being switched-in via the coupling impedance.

12. The switching device of claim 6, wherein the switching element is located in the path of the NMR signal.

13. A method for tuning a probe head impedance of an NMR receiving coil using an RF tuning signal, the receiving coil having a receiving circuit for an NMR signal, the method comprising the steps of:

a) producing a first reference signal using a real reference resistance at an input of the receiving circuit;

b) storing the first reference signal;

c) matching a reference impedance connected with a path of the RF tuning signal in the receiving circuit to the stored first reference signal to produce a second reference signal simulating the first reference signal;

d) storing the second reference signal; and e) tuning the probe head impedance at the input to the stored second reference signal.

* * * * *